United States Patent
Richter et al.

[11] Patent Number: 6,116,495
[45] Date of Patent: Sep. 12, 2000

[54] CIRCUIT-BOARD OVERLAID WITH A COPPER MATERIAL ON BOTH SIDES OR IN MULTIPLE LAYERS AND A METHOD OF FABRICATING SAME

[75] Inventors: Dietrich Richter, Berlin, Germany; Peter Straub, Oberwil/Zug, Switzerland; Marian Lancki, Berlin, Germany; Peter Diehm, Hagendorn/Cham, Switzerland; Dieter Berchtold, Pürgen; Hans-Georg Wissmeier, München, both of Germany

[73] Assignee: Siemens AG, Munich, Germany

[21] Appl. No.: 09/271,534

[22] Filed: Mar. 18, 1999

Related U.S. Application Data

[62] Division of application No. 08/996,356, Dec. 22, 1997, Pat. No. 5,914,861.

[30] Foreign Application Priority Data

Dec. 20, 1996 [DE] Germany .......................... 196 54 606

[51] Int. Cl.[7] .................................................. B23K 1/00
[52] U.S. Cl. ................................ 228/122.1; 228/179.1; 228/262.61
[58] Field of Search ............................. 228/122.1, 123.1, 228/124.1, 124.6, 179.1, 120, 262.61

[56] References Cited

U.S. PATENT DOCUMENTS

| | | |
|---|---|---|
| 3,710,193 | 1/1973 | Greenberg et al. . |
| 4,367,523 | 1/1983 | Urba . |
| 4,675,784 | 6/1987 | Dahlberg et al. . |
| 4,689,442 | 8/1987 | Ozaki . |
| 5,130,498 | 7/1992 | Yoshida et al. . |
| 5,206,792 | 4/1993 | Reynolds ................................. 361/719 |
| 5,210,941 | 5/1993 | Turek et al. . |
| 5,394,301 | 2/1995 | Fassel et al. . |
| 5,467,251 | 11/1995 | Katchmar . |
| 5,539,618 | 7/1996 | Wiesa et al. . |
| 5,561,321 | 10/1996 | Hirano et al. . |
| 5,640,048 | 6/1997 | Selna . |
| 5,644,163 | 7/1997 | Tsuji ........................................ 257/706 |

FOREIGN PATENT DOCUMENTS

| | | |
|---|---|---|
| 0 712 153 | 5/1996 | European Pat. Off. . |
| 0 766 506 | 4/1997 | European Pat. Off. . |
| 31 15 017 | 11/1982 | Germany . |
| 37 37 889 | 5/1989 | Germany . |
| 41 07 312 | 9/1992 | Germany . |
| 42 24 720 | 2/1994 | Germany . |
| 43 26 506 | 2/1995 | Germany . |
| 195 06 664 | 2/1996 | Germany . |
| 402248067 | 10/1990 | Japan ................................. 228/122.1 |
| 404158559 | 6/1992 | Japan ................................. 228/248.1 |

OTHER PUBLICATIONS

IPC–Standard, "Proposal Qualification and Performance Specification for Metal Core Boards," Institute for Interconnecting and Packaging Electronic Circuits, 1985, pp. 1–5.

"Thermal Enhancement for a Printed Wiring Board, Thermal Finger Pad," IBM Technical Disclosure Bulletin, vol. 33, No. 4, Sep. 1990, NY, US, pp. 403–404.

Druckschrift, "Roger High Frequency Circuit Materials RO 4000™" der Firma Rogers Corporation, Chandler, AZ, USA.

*Primary Examiner*—Samuel M. Heinrich
*Attorney, Agent, or Firm*—Kenyon & Kenyon

[57] ABSTRACT

A circuit-board overlaid with a copper material on both sides with a lead-tin layer on the copper material and a plate-shaped heat sink (6). To achieve desirable dissipation of heat generated by electronic components on such circuit-board, the heat sink (6) is provided with a copper surface and then a layer of silver (8) applied to it is soldered to one side of the circuit-board (1). In a method of fabricating the circuit-board, a heat sink (6) having a copper surface is provided with a silver layer (8) and is applied to the circuit board (1) with its side (7) having the silver layer (8) The heat sink (6) is pressed with the circuit board (1) and a heated platen (20) in close contact with the heat sink (6).

6 Claims, 3 Drawing Sheets

CIRCUIT-BOARD OVERLAID WITH A COPPER MATERIAL ON BOTH SIDES OR IN MULTIPLE LAYERS AND A METHOD OF FABRICATING SAME

This application is a divisional of Ser. No. 08/996,356 filed Dec. 22, 1997 Pat. No. 5,914,861.

FIELD OF THE INVENTION

The present invention relates to a circuit-board overlaid with a copper material on two sides or in multiple layers with a lead-tin layer on the copper material and a heat sink in the form of a board.

BACKGROUND OF THE INVENTION

A conventional circuit-board is described in the publication, IPC Standard 1985, "Proposal Qualification and Performance Specification for Metal Core Boards" of the Institute for Interconnecting and Packaging Electronic Circuits, pp. 1–5. The conventional circuit-board comprises three parts: an internal metal core plate as the heat sink and two plastic plates arranged on both sides of the metal core plate and bonded to it. On their sides facing away from the metal core plate, the plastic plates are copper-clad and provided with a lead-tin layer in the conventional way for mounting electronic components. The metal core plate forms a plate-shaped heat sink by which the heat generated by the electronic components can be properly dissipated. However, the dissipation of heat with the conventional circuit-board is not optimal because heat transfer from the plastic plates to the plate-shaped heat sink is prevented by the adhesive layers.

SUMMARY OF THE INVENTION

An object of the present invention is to provide a circuit-board overlaid with a copper material on two sides or in multiple layers by which heat can be properly dissipated even from electronic components on the circuit board that generate large amounts of heat.

To achieve the aforementioned object, the heat sink, provided with a copper surface and a silver layer applied to the latter, is soldered onto one side of the circuit-board. The method of mounting the heat sink board to the circuit-board leads to a desirable thermal transfer between the circuit-board and the heat sink, so that the heat generated by electronic components on the circuit -board is dissipated very well.

With the circuit-board according to the present invention, the heat sink may have various designs. It is advantageous if the heat sink is a copper plate because production of the circuit-board is simplified since only application of the silver layer is necessary as an intermediate operation before soldering the copper plate to the circuit-board.

According to the present invention, it is also advantageous if the heat sink is a plastic plate clad with copper and provided with a silver layer on at least one side and having heat dissipating holes. Production of such a plastic plate does not pose any notable problems within the context of fabrication of the circuit-board because the plastic plate can be manufactured with equipment available in circuit-board fabrication. A suitable material for such a plastic plate would be a plastic having a high thermal conductivity and a coefficient of thermal expansion approximately comparable to that of copper and silver. Such a choice of materials ensures that the bond between the plastic plate and the circuit-board will hold reliably.

To promote the dissipation of heat when using the heat sink consisting of the plastic plate, it is advantageously plated through with copper in the area of the heat dissipating holes. The dissipation of heat is particularly good if the heat dissipating holes are filled with a thermally conducting paste.

If the evolution of heat by the electronic components on the circuit-board is especially high and thus a marked dissipation of heat is necessary, a metal heat discharge plate is advantageously pressed into the plastic plate. The dissipation of heat by conduction or radiation is promoted by the heat dissipation plate.

The present invention also relates to a method of manufacturing a circuit-board overlaid with a copper material on both sides and with a lead-tin layer on the copper material and a plate-shaped heat sink. The method provides according to the present invention that the heat sink having a copper surface be provided with a silver layer. The heat sink with its silver-plated side is placed onto the circuit-board and the heat sink is pressed with the circuit-board, while a heated platen is applied to the heat sink.

An advantage of the method according to the present invention is that heating of the junction between the circuit board and the heat sink is achieved due to the heated platen so that the -heat sink is soldered to the one side of the circuit-board. Pressing here results in an intimate bonding of the heat sink to the circuit-board on the one side, so that a desirable thermal and electrical junction is ensured. The application of heat in pressing is selected so that the lead-tin layer on the side of the circuit-board facing away from the heat sink does not melt. Therefore, the lead-tin layer on the side facing away from the heat sink retains its original melting point, while the lead-tin layer between the circuit-board and the heat sink now has a higher melting point due to soldering and pressing. This makes it possible in soldering components to the side facing away from the heat sink to melt only the lead-tin layer on this side of the circuit-board and to solder the components. The junction between the circuit-board and the heat sink is not affected by soldering the components.

If melting of the lead-tin layer on the side facing away from the heat sink in pressing the circuit-board to the heat sink cannot be prevented by another platen at room temperature opposite the heated platen, then according to another exemplary embodiment of the method according to the present invention, the side of the circuit-board facing away from the heat sink is cooled in pressing.

The cooling can be accomplished in different ways. It is advantageous if another platen opposite the heated platens is cooled during pressing. Optionally, it may be sufficient if the cooling is performed using a cooling plate placed on the side of the circuit-board facing away from the heat sink in pressing, so that the cooling plate projects out of the pressing apparatus and thus produces the cooling effect.

DETAILED DESCRIPTION OF THE INVENTION

Figure 1:
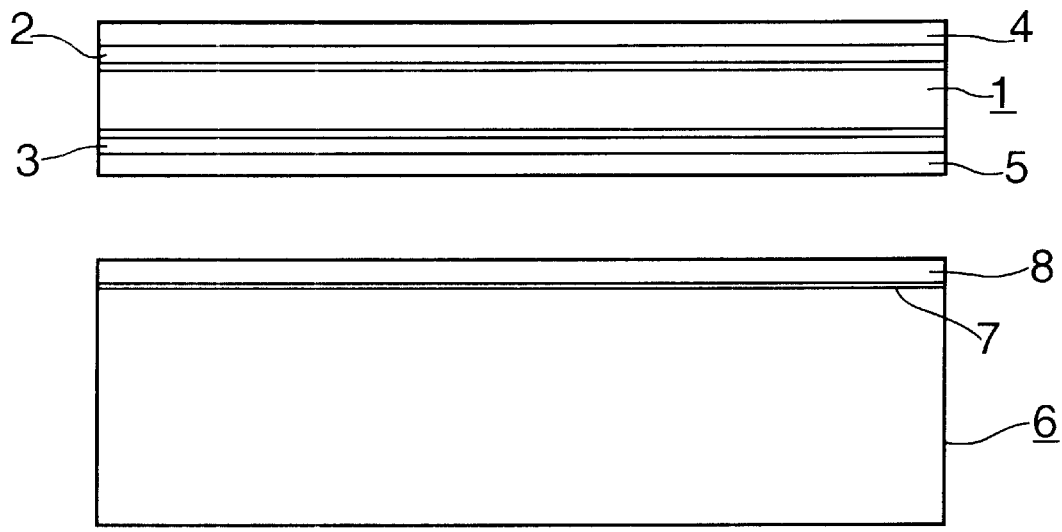
FIG. 1 shows an exploded side view of a circuit-board and a heat sink to be bonded to the circuit-board.

FIG. 1 shows a circuit-board 1 having copper cladding 2 and 3 on both sides. A lead-tin layer 4 and 5 is applied to the copper cladding 2 and 3, respectively.

Furthermore, FIG. 1 shows a heat sink formed by a copper plate 6. The copper plate 6 is provided with a silver layer 8 on one side 7.

Figure 2:
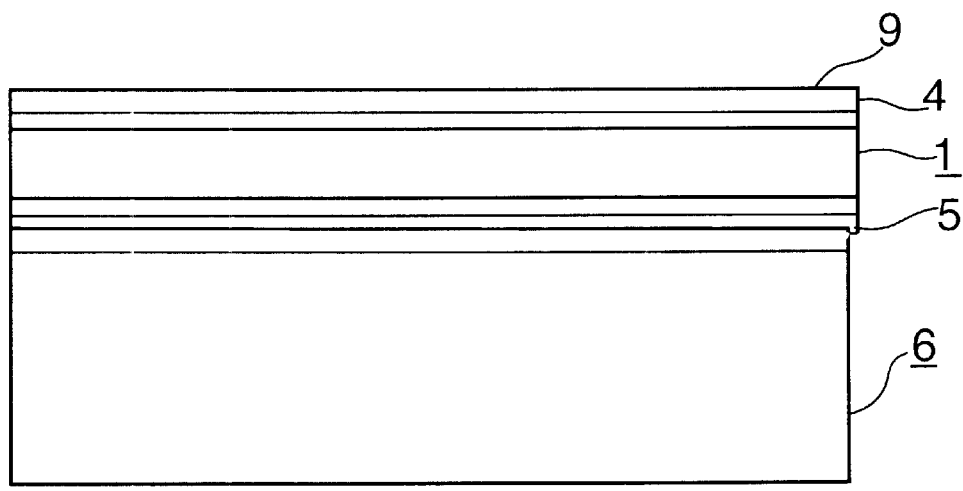
FIG. 2 shows a side view of the circuit-board soldered to the heat sink according to FIG. 1.

As explained in greater detail below, the copper plate 6 is soldered and pressed to the circuit-board 1, so that then the circuit-board 1 with the copper plate 6 forms a cohesive laminate as shown in FIG. 2. The lead-tin layer 5 on the circuit-board 1 causes it to be soldered to the plastic plate 6, so that the heat generated by components (not shown) on the top side of the circuit-board 1 in FIG. 2 can be transmitted to the copper plate 6 and radiated away from the latter.

The arrangement of the circuit-board 1 and the copper plate 6, shown in FIG. 2 can then readily be provided with electronic components on side 9, as is conventional in the manufacture of circuit-boards. Due to the soldering of the circuit-board 1 to the copper-plate 6, the lead-tin layer 5 between the circuit-board 1 and the copper plate 6 has a higher melting point than the lead-tin layer 4 on side 9 of the circuit-board 1.

Figure 3:
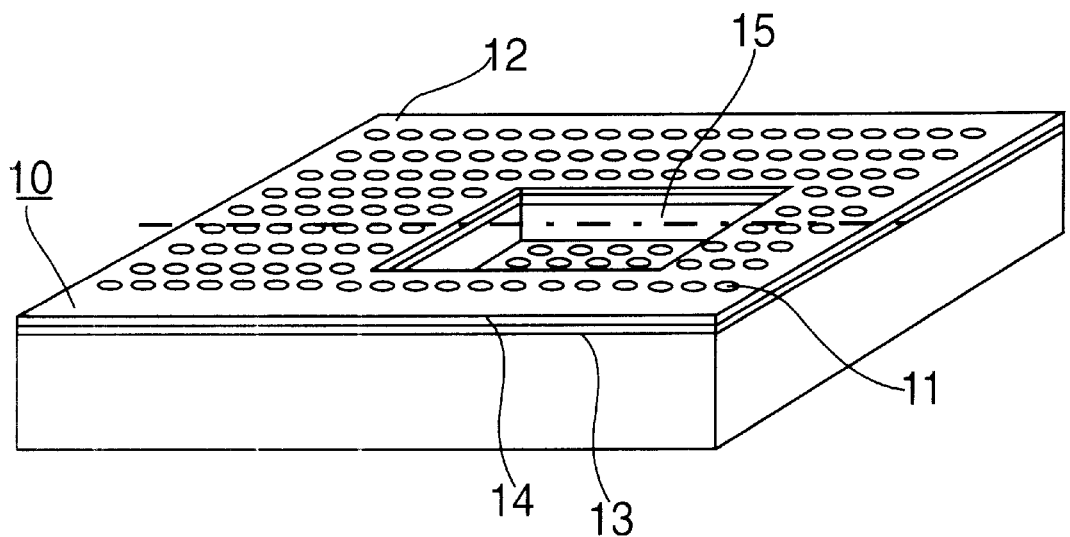
FIG. 3 shows a perspective diagram of a heat sink formed by a plastic plate.

FIG. 3 shows a heat sink formed by a plastic plate 10. The plastic plate 10 is made of a material having a high thermal conductivity and a coefficient of thermal expansion corresponding approximately to that of a copper material. Such plastic is available under code name RO 4000 from Rogers, USA. The plastic is described in detail in the publication "Rogers High Frequency Circuit Materials RO 4000" of Rogers Corporation, Chandler, Ariz., USA. To impart an especially high heat dissipating capacity to the plastic plate 10, the plastic plate is provided with heat dissipating holes 11, which are also known as thermal vias. The heat dissipating holes are through plated with a copper material in the interior (not shown in FIG. 3). To further increase the heat dissipating capacity, the holes may be filled with a conducting paste, although the paste is preferably applied only after the plastic plate 10 has been bonded to a circuit-board (not shown in FIG. 3) corresponding to the circuit-board 1 according to FIGS. 1 and 2.

To bond the plastic plate 10 to a circuit-board by soldering, it is copper plated on its surface 12 (copper cladding 13) and then provided with a silver layer 14—preferably by electroplating. The plastic plate 10 is thus prepared to the extent of the copper plate 6 according to FIGS. 1 and 2.

Figure 4:
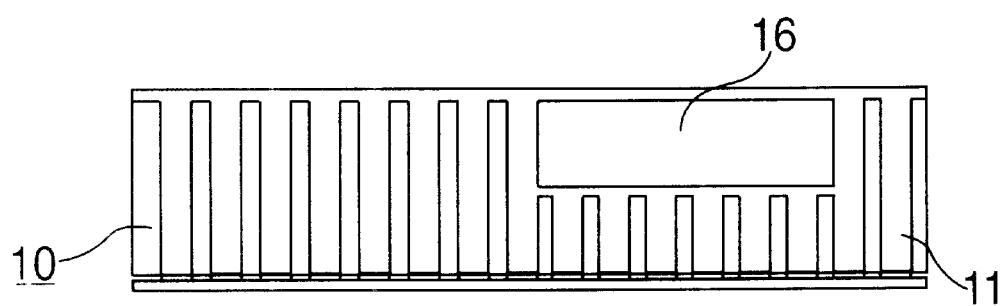
FIG. 4 shows a section through a plastic plate according to FIG. 3 along line IV—IV with a heat dissipating plate pressed into it.

As FIG. 3 shows, the plastic plate 10 is provided with a rectangular recess 15. A heat dissipating plate 16 is pressed into the recess 15, as shown in FIG. 4. The heat dissipating plate 16 may be made of copper or aluminum.

Figure 5:
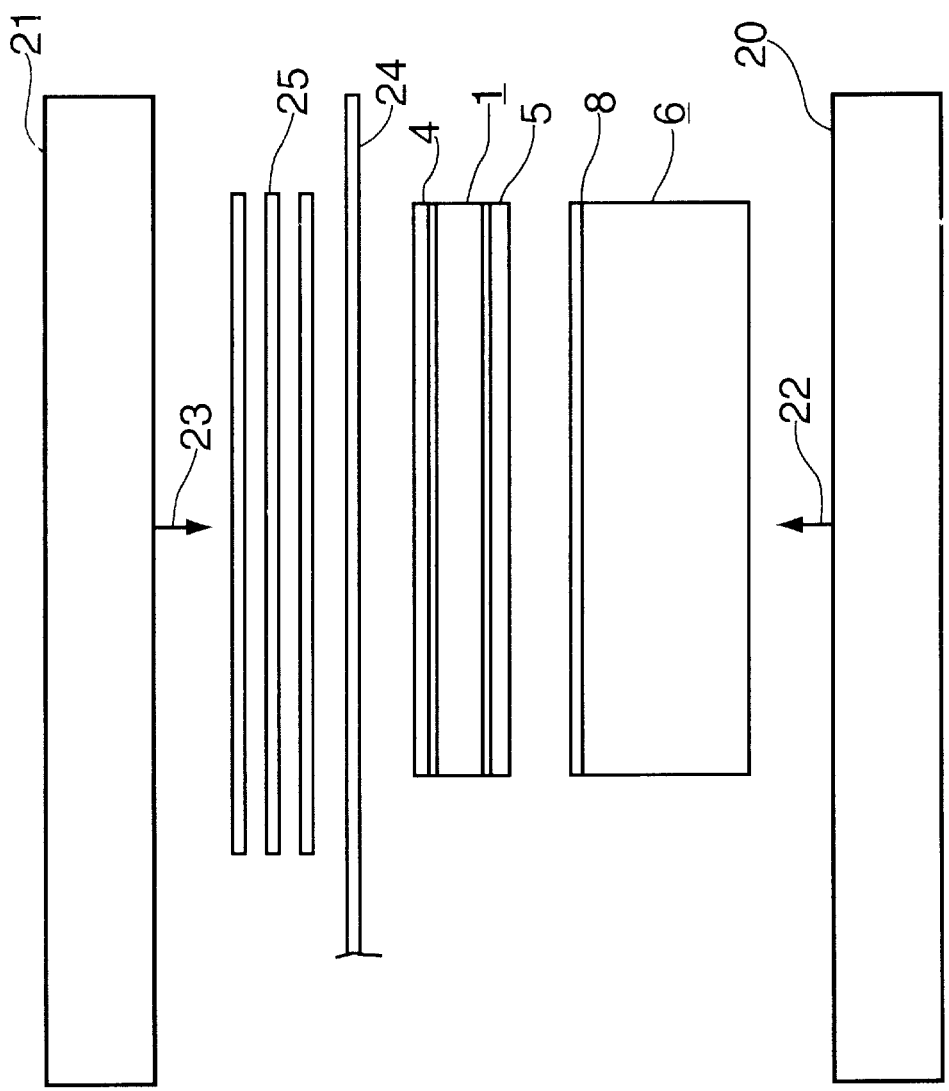
FIG. 5 shows an exploded side view of a pressing apparatus for carrying out the process according to the present invention with circuit-board and heat sink placed in it.

In FIG. 5, a pressing apparatus suitable for manufacturing the circuit-board with the method according to the present invention is shown only with a heated platen 20 and another platen 21, opposite the heated platen 20. To better illustrate the present invention, FIG. 5 shows individual components that are in intimate contact between the two platens 20 and 21 as if they were some distance apart.

As FIG. 5 shows in detail, the circuit-board 1 according to FIGS. 1 and 2 and the copper plate 6 according to the same figures is arranged between the two platens 20 and 21 so that the copper plate 6 is opposite the lead-tin layer 5 with the silver layer 8. A cooling structure or a cooling plate 24 that projects outward out of the area of the platens 20 and 21 is applied to side 9 of the circuit-board 1 facing away from the copper plate 6 and is responsible for cooling the lead-tin layer 4 of the circuit-board 1 during pressing and soldering. Above the cooling plate 24 there is a pressure pad 25 or a pressure equalizing insert, e.g., a spring structure. When using a spring structure, cooling can also be accomplished well using a stream of air.

In the manufacture of the circuit-board according to the present invention, the platens 20 and 21 are guided toward each other, compressing the parts between them with the circuit-board 1 and the copper plate 6, with the copper plate 6 being heated by the heated platen 20 so that the lead-tin layer 5 melts. The circuit-board 1 is thus soldered to copper plate 6. The cooling plate 24 ensures that the lead-tin layer 4 does not melt. Thus, the lead-tin layer 4 retains its original melting point, while the melting point of the lead-tin layer 5 is raised by the soldering.

After soldering the circuit-board 1 to the copper plate 6, the platens 20 and 21 can be moved apart, and the laminate of the circuit-board 1 and the copper plate 6 can be removed. Then the laminate can be provided with electronic components as customary in circuit-board fabrication.

What is claimed is:

1. A method of producing a circuit-board overlaid with a copper material on both sides of the circuit-board and a plate-shaped heat sink, comprising the steps of:

providing a silver layer on a side of the heat sink, the heat sink having a copper surface;

placing the side of the heat sink having the silver layer on the circuit-board;

pressing the heat sink on the circuit-board; and applying a heated platen to the heat sink.

2. The method according to claim 1, wherein the circuit board is overlaid with a lead-tin layer on the copper material.

3. The method according to claim 2, wherein a side of the circuit-board facing away from the heat sink is cooled in pressing.

4. The method according to claim 3, wherein a second platen is cooled during pressing and wherein the second platen is opposite to the heated platen.

5. The method according to claim 4, wherein a cooling is performed using a cooling plate applied to the side of the circuit-board facing away from the heat sink in pressing.

6. The method according to claim 5, wherein the cooling is performed using a stream of air.

* * * * *